(12) United States Patent
Fillion et al.

(10) Patent No.: US 8,008,781 B2
(45) Date of Patent: Aug. 30, 2011

(54) APPARATUS AND METHOD FOR REDUCING PITCH IN AN INTEGRATED CIRCUIT

(75) Inventors: Raymond Albert Fillion, Niskayuna, NY (US); Kevin M. Durocher, Waterford, NY (US); Richard Joseph Saia, Niskayuna, NY (US); Paul Alan McConnelee, Albany, NY (US)

(73) Assignee: General Electric Company, Schenectady, NY (US)

( * ) Notice: Subject to any disclaimer, the term of this patent is extended or adjusted under 35 U.S.C. 154(b) by 346 days.

(21) Appl. No.: 12/326,214

(22) Filed: Dec. 2, 2008

(65) Prior Publication Data

US 2010/0132994 A1 Jun. 3, 2010

(51) Int. Cl.
*H01L 23/48* (2006.01)
(52) U.S. Cl. ............... 257/774; 257/773; 257/E23.067; 257/E23.145
(58) Field of Classification Search .............. 257/773, 257/774, E23.067, E23.145
See application file for complete search history.

(56) References Cited

U.S. PATENT DOCUMENTS

| | | | |
|---|---|---|---|
| 5,353,195 A | 10/1994 | Fillion et al. | |
| 5,841,193 A * | 11/1998 | Eichelberger | 257/723 |
| 5,946,546 A | 8/1999 | Fillion et al. | |
| 6,239,482 B1 | 5/2001 | Fillion et al. | |
| 6,242,282 B1 | 6/2001 | Fillion et al. | |
| 6,396,153 B2 | 5/2002 | Fillion et al. | |
| 6,475,877 B1 | 11/2002 | Saia et al. | |
| 2006/0284640 A1* | 12/2006 | Wang et al. | 324/765 |
| 2008/0099885 A1* | 5/2008 | You et al. | 257/659 |
| 2008/0149379 A1* | 6/2008 | Nagase et al. | 174/260 |

* cited by examiner

*Primary Examiner* — Andy Huynh
(74) *Attorney, Agent, or Firm* — Ziolkowski Patent Solutions Group, SC; Jean K. Testa (57) ABSTRACT

An apparatus and method, the apparatus includes an electronic chip package including an electronic chip having a first contact pad and a second contact pad thereon and being free of an intervening contact pad therebetween, a first dielectric layer coupled to the electronic chip over the first and second contact pads, and a second dielectric layer coupled to the first dielectric layer such that a dielectric layer boundary is formed therebetween. The first dielectric layer has a first contact pad via formed therethrough at a first location corresponding to the first contact pad and extending down thereto. The second dielectric layer has a second contact pad via formed therethrough at a second location corresponding to the second contact pad and extending down thereto such that a second contact pad multi-layer via is formed through the first and second dielectric layers at the second location corresponding to the second contact pad.

20 Claims, 6 Drawing Sheets

APPARATUS AND METHOD FOR REDUCING PITCH IN AN INTEGRATED CIRCUIT

BACKGROUND

Embodiments of the invention relate generally to electronic chip package connections and, more particularly, to an electronic chip package of an electronic chip with contact pads having a minimized pitch therebetween.

Most semiconductor devices, such as bare chips, have electrical contact pads located on a top-side or active surface of the device to provide input/output (I/O) connections. As more complex devices are designed, the number of contact pads are increased and the pad pitch (i.e., the center-to-center distance between adjacent contact pads) is continually being reduced from 100 microns or so to 50 micron or less. Devices with perimeter pad pitches of 50 microns or so are often difficult to connect to when using an embedded chip interconnect technology. Chips with tighter pad pitches generally cannot be interconnected reliably or repeatedly since shorts often occur between cover pads associated the contact pads.

Embedded chip packaging technologies generally apply a first dielectric layer over a chip top surface, form vias in the dielectric layer such that they abut contact pads on the chip, and then form metal interconnections to the contact pads along the vias and metal cover pads about the via openings on a top surface of the dielectric layer. For yield and reliability issues, the metalized cover pad generally extends beyond the opening of the via. In general, the minimum contact pad pitch that can be accommodated is based upon the sum of the minimum via cover pad length and the minimum pad-to-pad tolerance. For example, a via that has an opening of twenty-five microns at chip surface may be forty microns at the top-side surface, and if the minimum metal feature is ten microns, then the metalized via cover pad diameter may need to be at least equal to the metalized via top-side opening plus twice the minimum metal feature (e.g., sixty microns). To be reliable, two adjacent metal cover pads, each generally centered over a via that is generally centered over the contact pad, should be electrically isolated from each other. As such, a gap or space is often needed between adjacent cover pads, each associated with a contact pad, to avoid shorts. It is generally understood, due to tolerances and variation in metallization, that the gap should be no less than the minimum metal feature size. That is, if the minimum feature size is ten microns, the minimum gap should be no less than ten microns. Accordingly, in the example set forth above, the minimum contact pad pitch should be no less than seventy microns. Such a minimum contact pad pitch places constraints on the design of semiconductor devices and, as technology progresses and the pad pitch of such semiconductor devices is desired to be further decreased to 50 microns or less, such a constraint is highly undesirable.

As such, it may be desirable to have a system that has aspects and features that differ from those that are currently available and that solves at least the aforementioned problems. Further, it may be desirable to have a method that differs from those methods that are currently available.

BRIEF DESCRIPTION OF THE INVENTION

Aspects of the invention provide an electronic chip package including an electronic chip having a first contact pad and a second contact pad thereon and being free of an intervening contact pad therebetween, a first dielectric layer coupled to the electronic chip over the first and second contact pads, and a second dielectric layer coupled to the first dielectric layer such that a dielectric layer boundary is formed between a top surface of the first dielectric layer and a bottom surface of the second dielectric layer. The first dielectric layer has a first contact pad via formed therethrough at a first location corresponding to the first contact pad and extending down thereto. The second dielectric layer has a second contact pad via formed therethrough at a second location corresponding to the second contact pad and extending down thereto such that a second contact pad multi-layer via is formed through the first and second dielectric layers at the second location corresponding to the second contact pad.

Aspects of the invention also provide an electronic chip interconnect system including a first and a second contact pad coupled to a substrate and a dielectric stack coupled to the substrate. The second contact pad is positioned consecutive to the first contact pad. The dielectric stack includes a first dielectric layer coupled to the substrate, a second dielectric layer coupled to the first dielectric layer such that a boundary is formed therebetween, a first cover pad positioned along the boundary and substantially aligned with the first contact pad, and a second cover pad positioned along a top surface of the second dielectric layer and substantially aligned with the second contact pad. The dielectric stack has a second contact pad multi-layered via formed through the first and second dielectric layers extending from the second cover pad to the second contact pad.

Aspects of the invention also provide a method that includes providing an electronic chip having a first and a second contact pad thereon, providing a first dielectric layer and a second dielectric layer each having a top surface and a bottom surface, adhering the bottom surface of the first dielectric layer to the electronic chip, forming a first contact pad via through the first dielectric layer at a location corresponding to the first contact pad, forming a first cover pad on one of the top surface of the first dielectric layer and the bottom surface of the second dielectric layer at a location corresponding to the first contact pad via, adhering the bottom surface of the second dielectric layer to the top surface of the first dielectric layer, forming a second contact pad via through the first and second dielectric layers at a location corresponding to the second contact pad, the second contact pad via comprising a multi-layered via, and forming a second cover pad on the top surface of the second dielectric layer at a location corresponding to the second contact pad via. The substrate is free of an intervening contact pad between the first and second contact pads.

Various other features may be apparent from the following detailed description and the drawings.

BRIEF DESCRIPTION OF THE DRAWINGS

The drawings illustrate at least one preferred embodiment presently contemplated for carrying out the invention.

In the drawings.

DETAILED DESCRIPTION

The invention includes embodiments that relate to reduction of pad-to-pad pitch in an electronic chip package and the electronic chip(s) within the package. Embodiments of the invention may be implemented in electronic chip packages fabricated using a wide variety of fabrication technologies. For example, embodiments of the invention may be implemented in electronic chip packages fabricated using build-up technologies such as embedded chip or flip-chip technologies.

Figure 1:
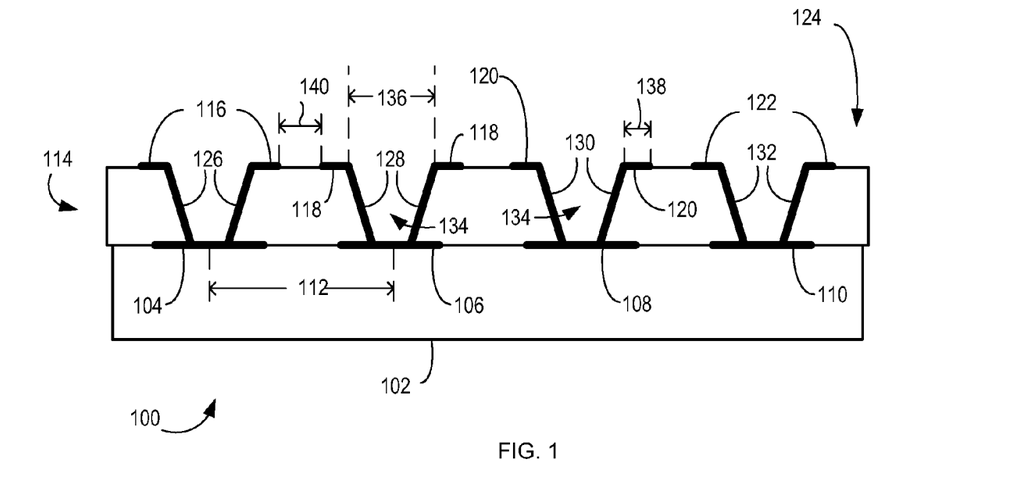
FIG. 1 is a cross-sectional view of an exemplary prior art partial electronic chip package.

Referring to FIG. 1, a cross-sectional view of a prior art electronic chip package 100 is shown. The prior art electronic chip package 100 includes an electronic chip 102, a plurality of contact pads 104, 106, 108, 110 having a center-to-center distance 112 (i.e., pitch), a dielectric layer 114, and a plurality of cover pads 116, 118, 120, 122 (i.e., conductive elements) along a top portion 124 of dielectric layer 114. Further, cover pads 116-122 are respectively connected to contact pads 104-110 by a plurality interconnects 126, 128, 130, 132, respectively.

During fabrication, interconnects 126-132 and cover pads 116-122 are deposited after a plurality of single-layer vias 134, each having a top-side via opening distance 136, are formed in dielectric layer 114. In the prior art shown, as is generally known, pitch 112 is often limited by the sum of via opening distance 136, a length of cover pad extension 138 times a multiple of two, and a cover pad to cover pad gap distance 140. That is, as is generally understood, a minimum pitch 112 is often no less than the sum of via opening distance 136, cover pad extension length 138 times a multiple of two, and gap distance 140. Often, if pitch 112 is reduced below such a minimum, one or more of these features (i.e., via opening distance 136, cover pad extension length 138, and/or cover pad gap distance 140) need be reduced. Normal alignment and feature size variations resulting from manufacturing or fabrication tolerances can cause increased defects. As such, reducing feature sizes can also increase defects. For example, if cover pad gap distance 140 is reduced, metal defects can cause adjacent cover pads to touch; thus, resulting in an electrical short during use. Similarly, if the cover pad extension length 138 is reduced, variations can cause misalignment of cover pad 116-122 to via opening distance 136 resulting in a weak or defective via. Further, if the via opening 136 is reduced, the via may not completely form to a contact pad such as 104 causing a defective or open electrical connection to the electronic chip 102.

Figure 2:
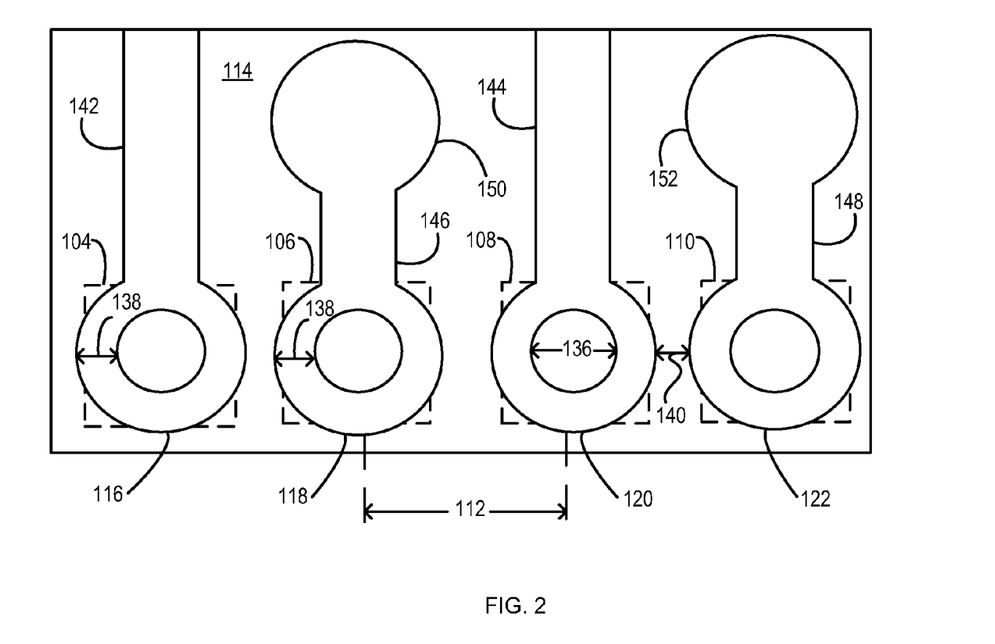
FIG. 2 is an exemplary top-side planar view of the prior art of FIG. 2.

Referring to FIG. 2, an exemplary top-side planar view of the prior art of FIG. 1 is shown. Each cover pad 116-122 expands beyond via opening distance 136 on all sides. A set of routing links 142, 144 respectively extend from cover pads 116, 120 to another area along a top portion of dielectric layer 114 to electrically connect contact pads 104, 108 to another interconnection structure such as a redistributed device pad (not shown), which allows for connection to a layer (not shown) above or below the top surface of the dielectric layer 114. An additional set of routing links 146, 148 respectively connected to cover pads 118, 122, each extend to a first layer pad 150, 152, which may form a connection to a layer (not shown) above or below dielectric layer 114. Also shown in FIG. 2 is cover pad extension distance 138, pitch 112, and gap distance 140.

Figure 3:
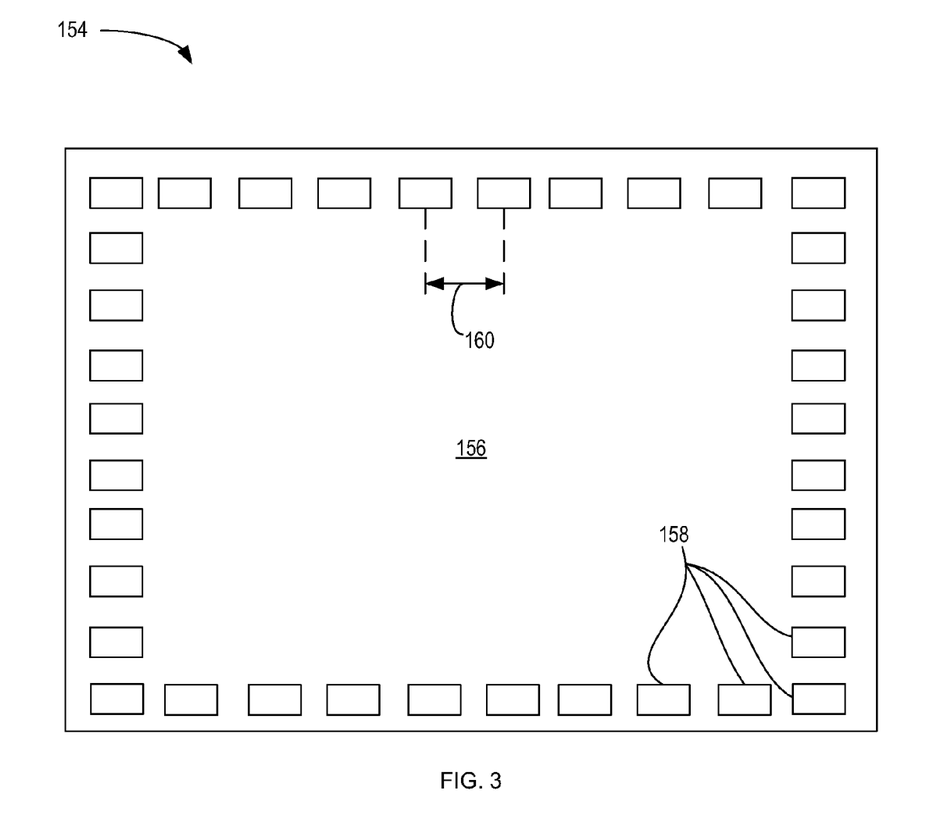
FIG. 3 is a top-side planar view of a bare electronic chip according to an embodiment of the invention.

Referring to FIG. 3, a schematic block diagram of a bare or unpackaged electronic chip 154 that may be used with embodiments of the invention is shown. As shown, bare electronic chip 154 includes a substrate 156 and a plurality of contact pads 158 thereon. Contact pads 158 may be placed on substrate 156 by a variety of techniques. For example, a metallization process or the like may be implemented to deposit contact pads 158 onto substrate 156. Alternative techniques such as etching or photolithography may also be implemented. Contact pads 158 may have a composition that includes a variety of materials such as, for example, aluminum, copper, gold, silver, and nickel, or combinations thereof.

Contact pads 158 of FIG. 3 are arranged such that they are spaced relative to one another. As such, each consecutive contact pad 158 has a pitch 160 therebetween. Details regarding the minimization of pitch 160 according to embodiments of the invention will be set forth below with respect to FIGS. 5-15.

Embodiments of the invention may use bare electronic chips having their contact pads arranged in a manner different than that shown in FIG. 3. For example, other bare electronic chips may have multiple perimeter rows of contact pads, rather than the single rows of contact pads 158 shown in FIG. 3. Additionally, semiconductor devices may be used that have arrays of contact pads located on any region of a substrate or one or more rows of contact pads generally arranged over the center region of the substrate. Further embodiments may have contact pads arranged along less than all four side of the perimeter of substrate. Still further embodiments of electronic chips may include contact pads arranged such that the spacing between contact pads varies.

Figure 4:
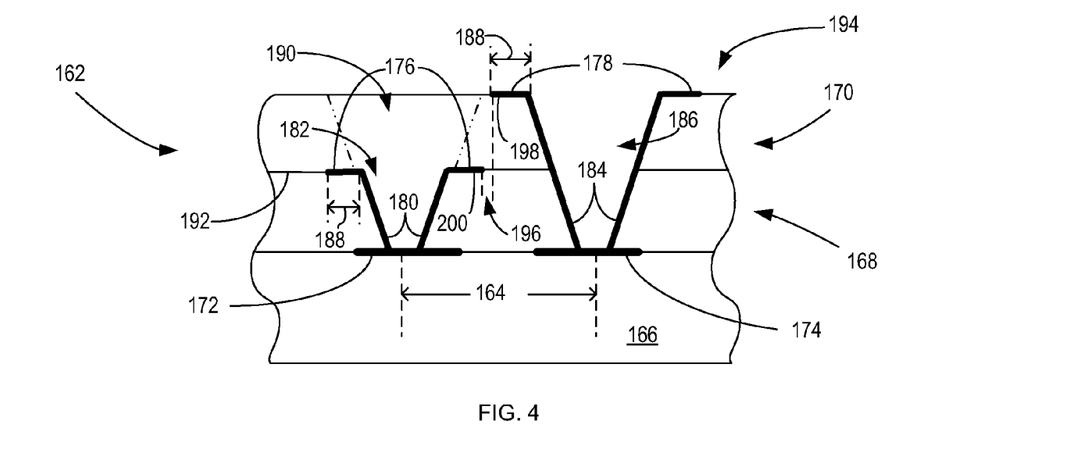
FIG. 4 is a cross-sectional view of a partial electronic chip package according to an embodiment of the invention.
Figure 5:
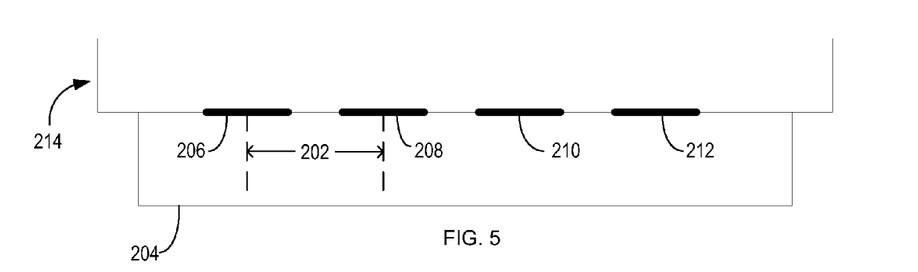
FIGS. 5-11 schematically show a cross-sectional view of an electronic chip package during development according to an embodiment of the invention.

Referring to FIG. 4, a cross-sectional view of a partial electronic chip package 162 having a chip contact pad pitch 164 minimized is shown according to an embodiment of the invention. Electronic chip package 162 includes an electronic chip 166, a first dielectric layer 168, and a second dielectric layer 170. First dielectric layer 168 may be formed of one of several known materials. For example, in one embodiment, first dielectric layer 168 includes a polymer material such as polymide with a thickness ranging from, for example, ten micrometers to one-hundred micrometers. In another embodiment, first dielectric layer 168 is a polymer such as a thermoset coating or a self-bonding film. In yet another embodiment, first dielectric layer 168 may include two sub-layers, where a polymer film sub-layer acts as the primary dielectric layer and an adhesive sub-layer secures the polymer film sub-layer layer to electronic chip 166. First dielectric layer 168 may, for example, be deposited by a spin, spray, or an extrusion coating process or may be laminated onto substrate 166 with heat and/or an adhesive. Second dielectric layer 170 may be of a composition similar to, or different than, first dielectric layer 168 and may also be applied in a manner similar to, or different than, that described above with respect to first dielectric layer 168. Though only two dielectric layers 168, 170 are shown in FIG. 4, it is contemplated that embodiments of the invention can include more than two dielectric layers.

Electronic chip package 162 also includes a plurality of contact pads on electronic chip 166, including a first contact pad 172 and a second contact pad 174. In addition, electronic chip package 162 includes a first-layer cover pad 176 and a second-layer cover pad 178. First layer cover pad 176 is connected to first contact pad 172 by a single-layer interconnect 180 that runs along or is formed in a first contact pad single-layer via 182, while second layer cover pad 178 is connected to second contact pad 174 by a multi-layer interconnect 184 that runs along or is formed in a double-layered via 186. Each cover pad 178, 180 has a minimum feature length 188 (i.e., a cover pad extension length).

As will be discussed in greater detail below with respect to FIGS. 12-14, it is contemplated that a single-layer interconnect such as interconnect 180 may run along a portion of a multi-layered via such as first contact pad multi-layered via 190 (shown in part in phantom), rather than along a single-layer via such as via 182. In such an embodiment, multi-layered via 190 extends through first and second dielectric layers 168, 170.

Except for single-layer interconnect 180, first dielectric layer 168 acts as an electrical insulator between first contact pad 172 and first layer cover pad 176, which is positioned along a boundary 192 between first and second dielectric layers 168, 170. In a similar manner, second dielectric layer 170 acts as an electrical insulator between second-layer cover pad 178 positioned along a top portion 194 of second dielectric layer 170 and first-layer cover pad 176 along boundary 192.

Since at least one double-layer via 186 is created and since cover pads 176, 178 are vertically staggered (i.e., first-layer cover pad 176 positioned along boundary 192 and second-layer cover pad 178 positioned along top portion 194 of second dielectric layer 170), electrical insulation between cover pads 176, 178 is provided by second dielectric layer 170. Accordingly, a gap distance 196 between cover pads 176, 178 can be reduced below feature length 188, which further allows for pitch 164 to be minimized. As shown in FIG. 4, first-layer cover pad 176 and second-layer cover pad 178 do not overlap on a common transverse vertical plane. That is, cover pad 176 is horizontally spaced from cover pad 178 by cover pad gap distance 196. However, since first-layer cover pad 176 is separated by second dielectric layer 170 from second-layer cover pad 178, it is contemplated that in embodiments of the invention there need not be horizontal separation distance 196. In other words, relative to a common transverse vertical plane, a portion 198 of second-layer cover pad 178 may overlap a portion 200 of first-layer cover pad 176; thus, further minimizing pitch 164.

It is also contemplated, as will also be discussed in greater detail with respect to FIGS. 5-15, that additional double-layered vias could be utilized to minimize pitch 164. Vias, whether single-layered vias (e.g., single-layer via 182 of FIG. 4) or multi-layered vias (e.g., multi-layered via 186 of FIG. 4), may be created using a variety of techniques. For example, in one embodiment, multi-layered via 186 and/or first contact pad single-layer via 182 are created by repeatedly scanning second and/or first dielectric layers 170, 168, respectively, with a continuous wave laser to create openings (i.e., vias) of desired size and shape extending down to the respective contact pad 174, 172. Other embodiments include, for example, using photopatterning photopatternable polymides, an excimer laser with a mask, laser ablation techniques, and/or chemical, plasma, or reactive etches to create vias.

Referring to FIGS. 5-11, development of an electronic chip package having a pad-to-pad pitch 202 of an electronic chip 204 minimized according to an embodiment of the invention are schematically shown. Beginning with FIG. 5, electronic chip 204 having a plurality of contact pads 206, 208, 210, 212 thereon is shown. Adhered to contact pads 206-212 and substrate 166 is a first dielectric layer 214.

Figure 6:
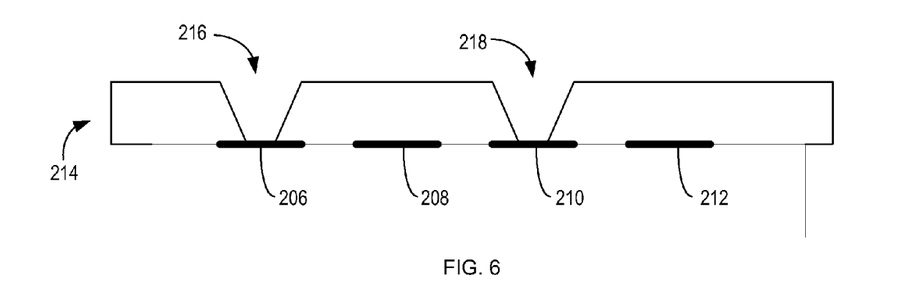

Referring now to FIG. 6, a plurality of single-layer vias 216, 218 are formed in first dielectric layer 214. As shown, single layer vias 216, 218 are created over first contact pad 206 and third contact pad 210, respectively. As discussed above with respect to FIG. 4, vias such as single-layer vias 216, 218 may be created by a variety of techniques.

Figure 7:
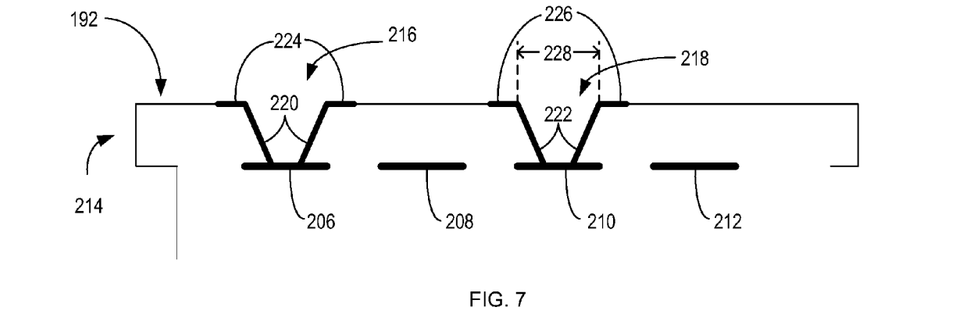

After single-layer vias 216, 218 are created, a process such as metallization is implemented to produce electric contacts and paths as shown in FIG. 7. As shown, each single-layer via 216, 218 has a single-layer interconnect 220, 222, respectively, deposited therein. Further, first dielectric layer 214 has a set of first-layer cover pads 224, 226 deposited thereon such that cover pads 224, 226 abut (e.g., encircle) an opening 228 of each respective single-layer via 216, 218. As such, first and third contact pads 206, 210 are respectively electrically coupleable to first-layer cover pads 224, 226 and to any contacts (not shown) coupled thereto.

A variety of metallization techniques may be employed to create first-layer cover pads 224, 226 and single-layer interconnects 220, 222. In one embodiment, single-layer interconnects 220, 222 and first-layer cover pads 224, 226 are deposited during a same metallization technique. For example, first-layer cover pads 224, 226 and single-layer interconnects 220, 222 may be created by sputtering or plating techniques followed by standard subtractive patterning using a photoresist etch process. In another embodiment, a semi-additive metal patterning process may be implemented, where a thin seed metal is applied to the first dielectric layer 214 followed by an application of a photoresist on the applied seed metal. The photoresist is then photopatterned to expose selected areas of metal. The exposed areas are then electroplated to the desired thickness, the photoresist is removed, and the exposed seed metal is removed by etching. Other exemplary metallization techniques may include metallization using surface activations.

As discussed above with respect to FIG. 4, a variety of metals may be used during metallization according to embodiments of the invention. For example, as an alternative to those metals discussed above, first-layer cover pads 224, 226 and single-layer interconnects 220, 222 may include an adhesion layer of sputtered copper that is coated by a layer of electroplated copper. Such an embodiment may also include an optional buffered layer of titanium applied over the electroplated copper. In another embodiment, the metallization materials include molybdenum, tungsten, and gold. The metals used during metallization may depend on the materials of the electronic chip, the materials of the contact pads, and on the environment in which the invention will be used. Further, the thickness of the metallization materials used can vary depending on the current requirement of the components of the electronic chip and package.

Figure 8:
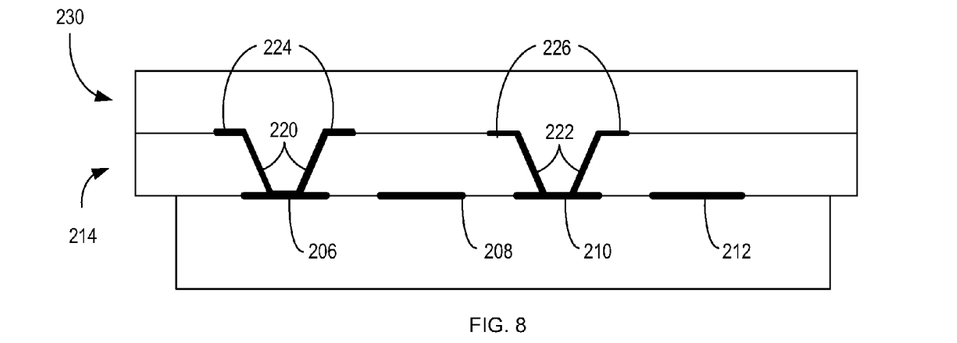

In the present embodiment, as shown in FIG. 8, after creating first-layer cover pads 224, 226 and single-layer interconnects 220, 222, a second dielectric layer 230 is adhered to first dielectric layer 214, first-layer cover pads 224, 226, and single-layer interconnects 220, 222.

Figure 9:
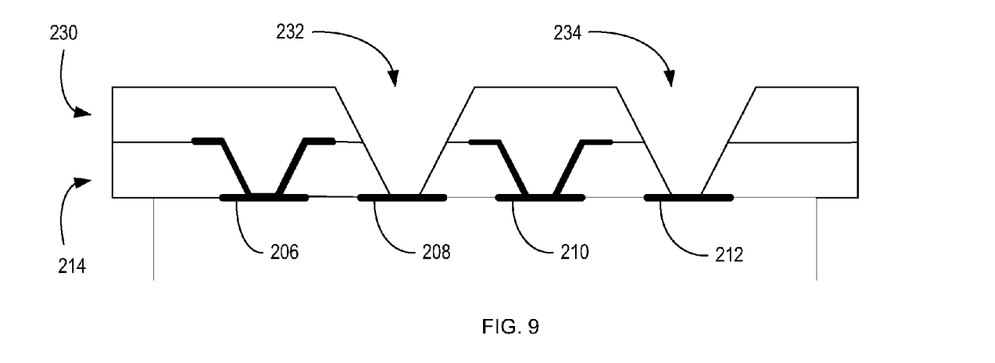

Proceeding to FIG. 9, after second dielectric layer 230 is adhered, a plurality of double-layered vias 232, 234 are created through second and first dielectric layers 230, 214 to contact pads 208, 212, respectively. Again, a wide variety of techniques may be implemented to created vias such as double-layered vias 232, 234.

Figure 10:
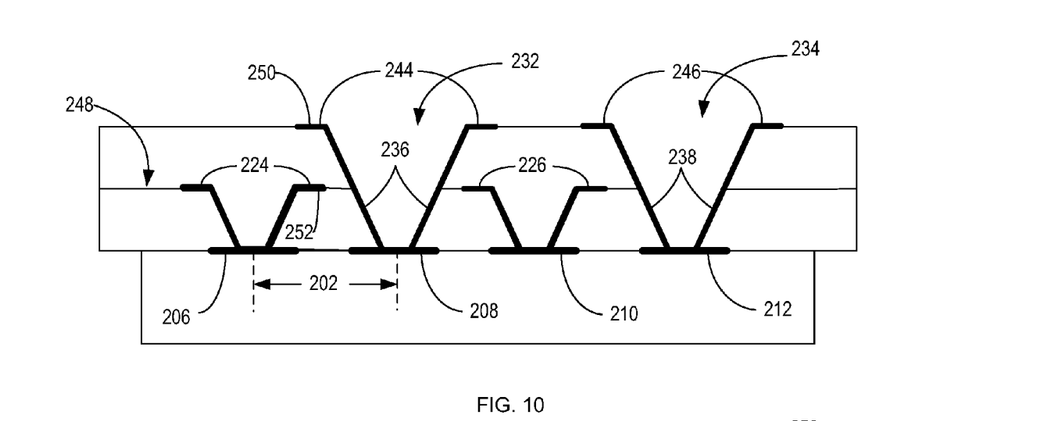

As shown in FIG. 10, after double-layer via 232, 234 creation, a plurality of multi-layer interconnects 236, 238 and second-layer cover pads 240, 242 are deposited or etched. The multi-layer interconnects 236, 238 extend down through vias 232, 234 from second-layer cover pads 244, 246 to contact pads 208, 212. As shown, dual-layer interconnections 236, 238 make no contact with first-layer cover pads 224, 226 or any other conductive elements that may be positioned along a first and second dielectric layer boundary 248. Accordingly, the vertical staggering of first-layer cover pads 224, 226 and second-layer cover pads 244, 246 along with interconnects 236, 238 formed on double-layered vias 232, 234 allow for pitch 202 to be minimized. As shown in the embodiment of FIG. 10, there is no gap distance (e.g., gap distance 196 of FIG. 4). Accordingly, relative to a transverse vertical plane to FIG. 10, a portion 250 of cover pad 244 overlaps a portion 252 of cover pad 224. It is contemplated, however, that pitch 202 could be increased to create a gap distance between two or more consecutive cover pads 224, 244, 226, 246.

Figure 11:
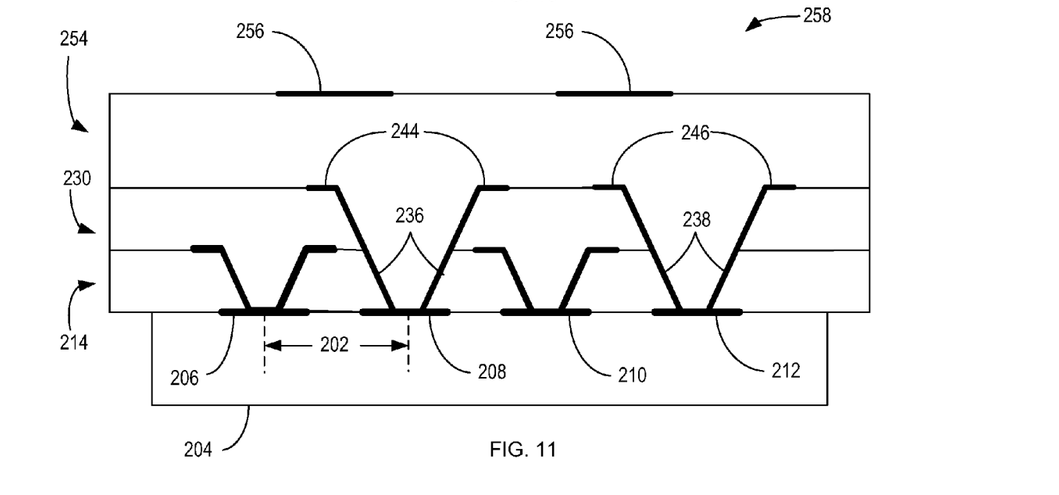

In one embodiment, as shown in FIG. 11, a third dielectric layer 254 is coupled to, or adhered over, second dielectric layer 230, second-layer cover pads 244, 246, and dual-layer interconnects 236, 238. Third layer 254 may, for example, be a solder mask or a passivation layer having dielectric properties. After coupling third layer 254 to second dielectric layer 230, a set of top-side or I/O pads 256 are then created on top of third dielectric layer 254; thus, completing an electronic chip package 258. It is contemplated that top-side pads 256 may be electrically coupled (not shown) to one or more of contact pads 206-212. Further, top-side pads 256 may be used to electrically connect electronic chip package 258 to other circuits or chips. It is also contemplated that top-side pads 256 can be located exterior to electronic chip 204. That is, it is contemplated that top-side pads 256 can be located outside the footprint of electronic chip 204.

Though three dielectric layers 214, 230, 254 are shown in FIG. 11, it is contemplated that embodiments of the invention may employ more than three dielectric layers. In addition, though four contact pads 206-212 are shown in FIGS. 5-11, it is contemplated that only two contact pads (e.g., see FIG. 4), three contact pads, or more than four contact pads may be used in a manner consistent with embodiments of the invention. As such, it is contemplated that other dielectric stacks having configurations different than those shown in FIG. 11 may be used in a manner consistent with embodiments of the invention. That is, electronic chip 204 may be coupled to other dielectric stacks having multi-layered vias coupled to contact pads in a manner consistent with embodiments of the invention.

Referring now to FIGS. 12-15, various levels of development for creating an electronic chip package with an electronic chip 262 having a contact pad pitch 260 minimized are schematically shown according to another embodiment of the invention. As will be discussed in greater detail below, the electronic chip includes a dielectric stack having a variety of interconnects and vias that are coupled to a substrate.

Figure 12:
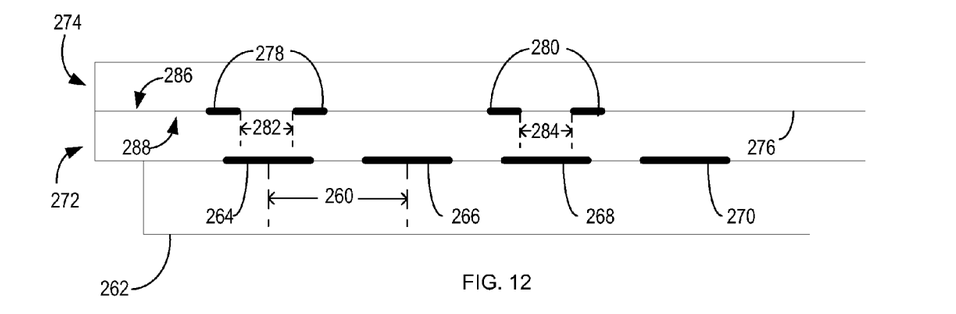
FIGS. 12-15 schematically show a cross-sectional view of another electronic chip package during development according to an embodiment of the invention.

Referring to FIG. 12, electronic chip 262 having a plurality of contact pads 264, 266, 268, 270 thereon is shown. Also shown is a first and a second dielectric layer 272, 274, respectively, having a boundary 276 therebetween. Along boundary 276 is a set of first-layer cover pads 278, 280 positioned above contact pad 264, 268, respectively. Each cover pad 278, 280 has a cover pad aperture or opening 282, 284. In one embodiment, cover pads 278, 280 are deposited along a top portion 286 of first dielectric layer 272 before second dielectric layer 274 is adhered to first dielectric layer 272. However, it is contemplated that cover pads 278, 280 may be placed along boundary 276 using a variety of other techniques. For example, first-layer cover pads 278, 280 may be adhered to a bottom portion 288 of second dielectric layer 274 before second dielectric layer 274 is adhered to first dielectric layer 272. In such an instance, each cover pad opening 282, 284 is respectively aligned over first and third contact pads 264, 268 as second dielectric layer 274 is applied or adhered to first dielectric layer 272. Additional structures (not shown) may also be positioned along boundary 276 such as a ground or a reference plane and/or passive structures (e.g., inductors, antenna, and couplers).

Figure 13:
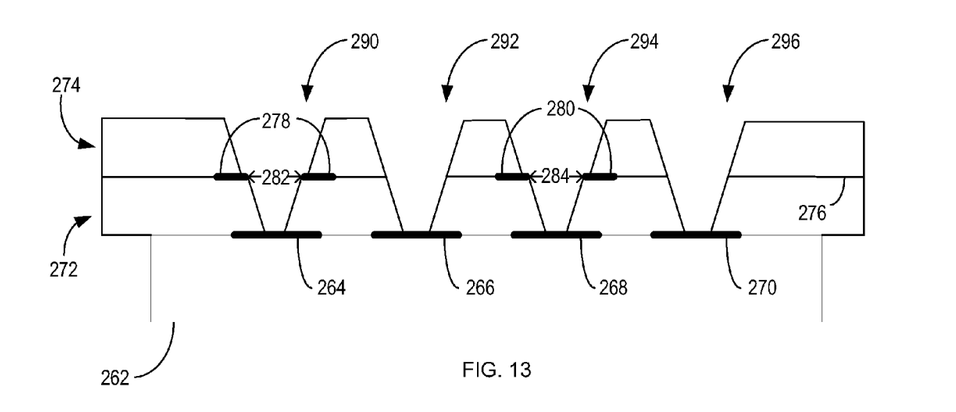

As shown in FIG. 13, after first and second dielectric layers 272, 274 are coupled to substrate 262, a plurality of multi-layered vias 290, 292, 294, 296 are created such that each respectively extends through second and first dielectric layers 274, 272 to respective contact pads 264-270. Multi-layered vias 290, 294, which extend to first and third contact pads 264, 268, can be considered shoot-through vias since they are "shot" through cover pad openings 282, 284 of first-layer cover pads 278, 280, respectively. As such, first layer cover pads 278, 280 serve as apertures that determine first-layer via size of multi-layer vias 290, 294.

Figure 14:
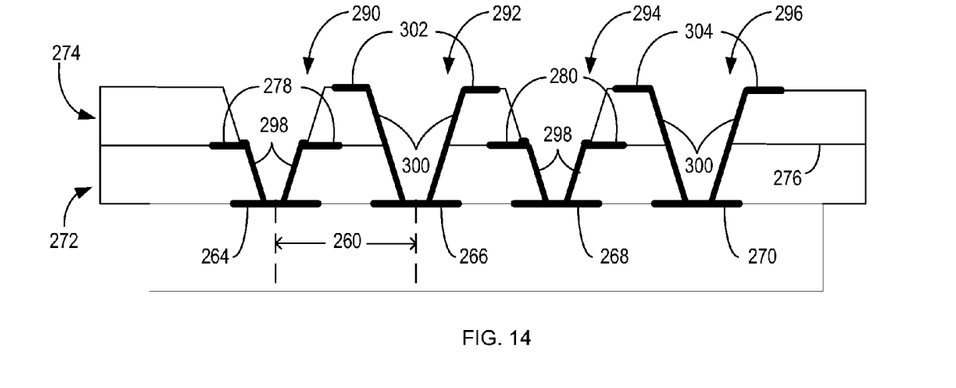

As shown in FIG. 14, after multi-layered vias 290-296 are created, a set of single-layer interconnects 298, a set of dual-layer interconnects 300, and a set of second-layer cover pads 302, 304 are created/applied. As shown, multi-layer interconnects 300 make no contact with conductive components along boundary 276. Again, since multi-tiered contact vias 290-296 were created and since cover pads 278, 302, 298, 304 are staggered in the vertical direction by second dielectric layer 270, pitch 260 (i.e., horizontal spacing) can be minimized. With respect to a transverse vertical plane to FIG. 4, by employing multi-layer vias 290-296 and staggered cover pads 278, 302, 298, 304, portions of second-layer cover pads 302, 304 can respectively overlap portions first-layer cover pads 278, 280. However, as discussed above with respect to FIG. 4, contact pads 264-270 may be spaced such that a gap distance (such as gap distance 196 shown in FIG. 4) lies between two or more consecutive cover pads 278, 302, 280, 304.

Figure 15:
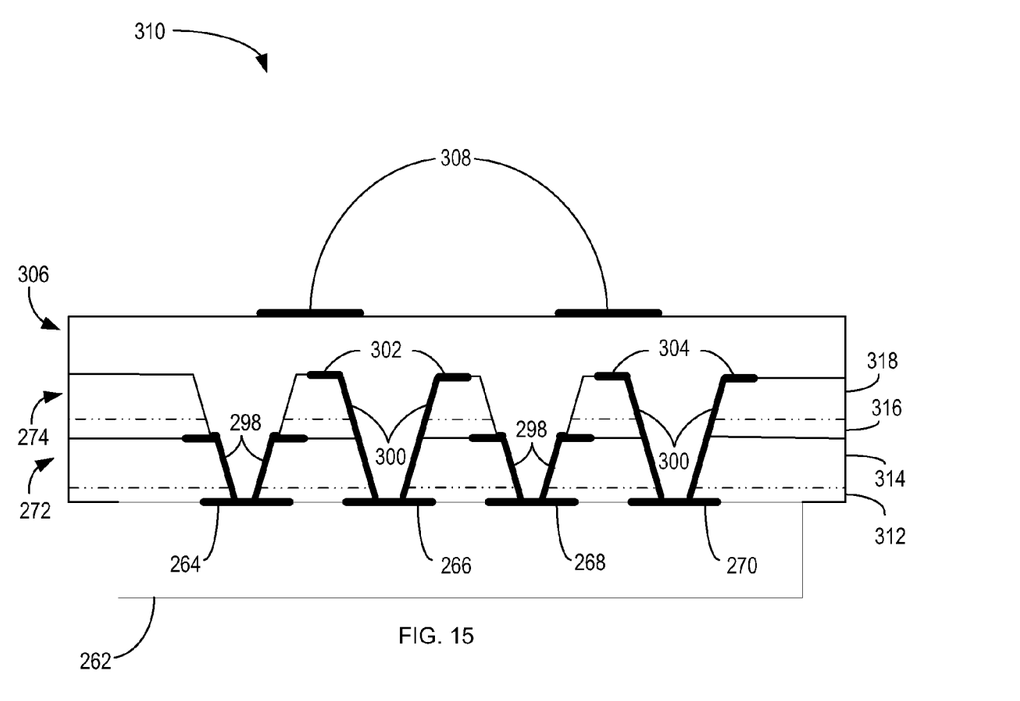

In one embodiment, as shown in FIG. 15, a third dielectric layer 306 such as a solder mask or passivation layer is coupled to, or adhered over, second dielectric layer 274, interconnects 298, 300, and second layer cover pads 302, 304. A set of top-side or I/O pads 308 are then created on top of third dielectric layer 306; thus, completing an electronic chip package 310. It is contemplated that top-side pads 308 may be electrically coupled (not shown) to one or more of contact pads 264-270. Further, top-side pads 308 may be used to electrically connect electronic chip package 310 to other circuits or chips. It is also contemplated that top-side pads 308 can be located exterior to electronic chip 262. That is, it is contemplated that top-side pads can be located outside the footprint of electronic chip 262.

It is contemplated that one or more of dielectric layers 272, 274, 306 may include sub-layers. For example, a plurality of dielectric sub-layers 312, 314, 316, 318 of dielectric layers 272, 274 are shown in phantom in FIG. 15. In one embodiment, first dielectric layer 272 includes two sub-layers 312, 314 and second dielectric layer 274 also includes two sub-layers 316, 318. It is contemplated that third dielectric layer 306 may include sub-layers and that first and/or second dielectric layers 272, 274 may include additional sub-layers without restriction. Further, as discussed above, it is contemplated that a variety of dielectric materials may be used in a manner consistent with embodiments of the invention. For example, dielectric sub-layers 312, 316 may be adhesives that couple dielectric layers 272 and 274, respectively, to electronic chip 262. Further examples of dielectric materials may include, without restriction, barrier coatings, resistive dielectrics, and capacitive dielectrics in the form of films, sheets, or spray-ons.

Figure 16:
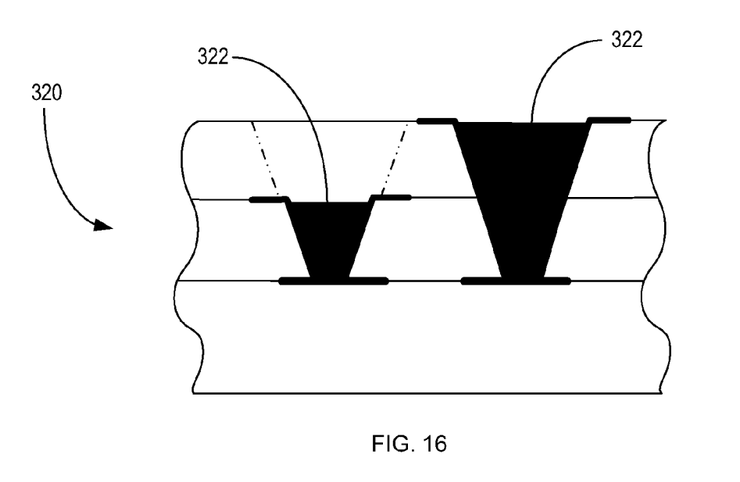
FIG. 16 is a cross-sectional view of a partial electronic chip package having solid post interconnects according to an embodiment of the invention.

Though conformal interconnects 180, 184, 220, 222, 236, 238, 298, 300 are depicted in FIGS. 4-15, other embodiments may implement solid post structures (i.e., post interconnects) that partially or totally fill vias. For example, as shown according to an embodiment in FIG. 16, a portion of an electronic chip package 320 having a set of solid post interconnects 322 is depicted. A variety of metallization techniques may be implemented to create post interconnects 322. Often referred to as solid via plating, such metallization techniques often form a solid metal in vias either by implementing a selective pattern plate-up of the via metal or, through mechanisms of differential etching and plating rates, implement a pulsed plating that alternately plates and etches metal.

According to an embodiment of the invention, an electronic chip package includes an electronic chip having a first contact pad and a second contact pad thereon and being free of an intervening contact pad therebetween, a first dielectric layer coupled to the electronic chip over the first and second contact pads, and a second dielectric layer coupled to the first dielectric layer such that a dielectric layer boundary is formed between a top surface of the first dielectric layer and a bottom surface of the second dielectric layer. The first dielectric layer has a first contact pad via formed therethrough at a first location corresponding to the first contact pad and extending down thereto. The second dielectric layer has a second contact pad via formed therethrough at a second location corresponding to the second contact pad and extending down thereto such that a second contact pad multi-layer via is formed through the first and second dielectric layers at the second location corresponding to the second contact pad.

According to another embodiment of the invention, an electronic chip interconnect system includes a first and a second contact pad coupled to a substrate and a dielectric stack coupled to the substrate. The second contact pad is positioned consecutive to the first contact pad. The dielectric stack includes a first dielectric layer coupled to the substrate, a second dielectric layer coupled to the first dielectric layer such that a boundary is formed therebetween, a first cover pad positioned along the boundary and substantially aligned with the first contact pad, and a second cover pad positioned along a top surface of the second dielectric layer and substantially aligned with the second contact pad. The dielectric stack has a second contact pad multi-layered via formed through the first and second dielectric layers extending from the second cover pad to the second contact pad.

According to yet another embodiment of the invention, a method includes providing an electronic chip having a first and a second contact pad thereon, providing a first dielectric layer and a second dielectric layer each having a top surface and a bottom surface, adhering the bottom surface of the first dielectric layer to the electronic chip, forming a first contact pad via through the first dielectric layer at a location corresponding to the first contact pad, forming a first cover pad on one of the top surface of the first dielectric layer and the bottom surface of the second dielectric layer at a location corresponding to the first contact pad via, adhering the bottom surface of the second dielectric layer to the top surface of the first dielectric layer, forming a second contact pad via through the first and second dielectric layers at a location corresponding to the second contact pad, the second contact pad via comprising a multi-layered via, and forming a second cover pad on the top surface of the second dielectric layer at a location corresponding to the second contact pad via. The substrate is free of an intervening contact pad between the first and second contact pads.

The invention has been described in terms of the preferred embodiment, and it is recognized that equivalents, alternatives, and modifications, aside from those expressly stated, are possible and within the scope of the appending claims.

What is claimed is:

1. An electronic chip package comprising:
   an electronic chip having a first contact pad and a second contact pad thereon, the electronic chip being free of an intervening contact pad between the first and second contact pads;
   a first dielectric layer coupled to the electronic chip over the first and second contact pads, the first dielectric layer having a first contact pad via formed therethrough at a first location corresponding to the first contact pad and extending down thereto;
   a second dielectric layer coupled to the first dielectric layer such that a dielectric layer boundary is formed between a top surface of the first dielectric layer and a bottom surface of the second dielectric layer, the second dielectric layer having a second contact pad via formed therethrough at a second location corresponding to the second contact pad and extending down thereto such that a second contact pad multi-layer via is formed through the first and second dielectric layers at the second location corresponding to the second contact pad;
   a first cover pad having a cover pad aperture therethrough and positioned along the dielectric layer boundary at a location corresponding to the first contact pad;
   a second cover pad coupled to a top surface of the second dielectric layer at a location corresponding to the second contact pad; and
   a second metal interconnect positioned in the second contact pad multi-layer via and extending from the second cover pad down to the second contact pad.

2. The electronic chip package of claim 1 wherein the first contact pad via comprises a first contact pad multi-layer via formed through the second dielectric layer, the first cover pad aperture, and the first dielectric layer.

3. The electronic chip package of claim 2 further comprising a first metal interconnect positioned in the first contact pad multi-layer via and extending from the first cover pad down to the first contact pad.

4. The electronic chip package of claim 3 wherein the first metal interconnect comprises a first post interconnect at least partially filling the first contact pad multi-layer via, and wherein the second metal interconnect comprises a second post interconnect at least partially filling the second contact pad multi-layer via.

5. The electronic chip package of claim 1 wherein a portion of the second cover pad overlaps a portion of the first cover pad in a horizontal direction and is vertically spaced apart therefrom by the second dielectric layer.

6. The electronic chip package of claim 1 wherein the first contact pad via is a first single-layer contact pad via formed through the first dielectric layer.

7. The electronic chip package of claim 6 further comprising a first metal interconnect positioned in the first single-layer contact pad via and extending from the first cover pad down to the first contact pad.

8. The electronic chip package of claim 1 further comprising:
   a third contact pad on the electronic chip consecutive to the second contact pad;
   a third cover pad positioned along the dielectric layer boundary at a location corresponding to the third contact pad; and
   a third metal interconnect extending from the third contact pad to the third cover pad.

9. The electronic chip package of claim 1 further comprising:

a third dielectric layer electrically coupled to the second dielectric layer, the third dielectric layer having a plurality of interconnects formed therethrough; and a plurality of input/output (I/O) pads coupled to a top surface of the third dielectric layer, wherein each I/O pad is electrically coupled to one of the first and second contact pads.

10. The electronic chip package of claim 1 wherein the first contact pad via comprises a laser ablated via formed through the first and second dielectric layers, with the first contact pad via extending through the cover pad aperture of the first cover pad.

11. The electronic chip package of claim 1 wherein the first dielectric layer comprises an adhesive material to adhere the first dielectric layer to the electronic chip.

12. An electronic chip package interconnect system comprising:
   a first and a second contact pad coupled to a substrate, the second contact pad positioned consecutive to the first contact pad; and
   a dielectric stack coupled to the substrate, the dielectric stack comprising:
      a first dielectric layer coupled to the substrate;
      a second dielectric layer coupled to the first dielectric layer such that a boundary is formed therebetween;
      a first cover pad positioned along the boundary and substantially aligned with the first contact pad, the first cover pad comprising a circular cover pad having an aperture formed therethrough; and
      a second cover pad positioned along a top surface of the second dielectric layer and substantially aligned with the second contact pad, the second cover pad comprising a circular cover pad having an aperture formed therethrough;
      wherein the dielectric stack has a second contact pad multi-layered via formed through the first and second dielectric layers extending from the second cover pad to the second contact pad; and
      wherein the dielectric stack further comprises a metal interconnect coupled to the second cover pad and extending down through the second contact pad multi-layered via to the second contact pad.

13. The electronic chip package interconnect system of claim 12 wherein the dielectric stack further comprises a metal interconnect coupled to each of the first cover pad, a single-layer via, and the first contact pad; wherein the single-layer via extends from the first cover pad to the first contact pad.

14. The electronic chip package interconnect system of claim 12 further comprising a third dielectric layer coupled to the second dielectric layer.

15. The electronic chip package interconnect system of claim 12 wherein the second and first dielectric layers have a first contact pad multi-layered via formed therethrough, the first contact pad multi-layered via extending through the aperture of the first cover pad to the first contact pad.

16. The electronic chip package interconnect system of claim 15 wherein the dielectric stack further comprises a metal interconnect coupled to the first cover pad and extending down through a portion of the first contact pad multi-layered via to the first contact pad.

17. A method for minimizing contact pad pitch on an electronic chip package comprising:
   providing an electronic chip having a first and a second contact pad thereon, wherein the electronic chip is free of an intervening contact pad between the first and second contact pads;
   providing a first dielectric layer and a second dielectric layer each having a top surface and a bottom surface;
   adhering the bottom surface of the first dielectric layer to the electronic chip;
   forming a first contact pad via through the first dielectric layer at a location corresponding to the first contact pad;
   forming a first cover pad on one of the top surface of the first dielectric layer and the bottom surface of the second dielectric layer at a location corresponding to the first contact pad via;
   adhering the bottom surface of the second dielectric layer to the top surface of the first dielectric layer;
   forming a second contact pad via through the first and second dielectric layers at a location corresponding to the second contact pad, the second contact pad via comprising a multi-layered via; and
   forming a second cover pad on the top surface of the second dielectric layer at a location corresponding to the second contact pad via.

18. The method of claim 17 further comprising:
   metalizing the first contact pad via to form a first electrically conductive path, the first electrically conductive path extending from the first cover pad down to the first contact pad; and
   metalizing the second contact pad multi-layered via to form a second electrically conductive path, the second electrically conductive path extending from the second cover pad down to the second contact pad.

19. The method of claim 17 wherein forming the first cover pad comprises forming the first cover pad having a cover pad opening therein; and
   wherein forming the first contact pad via further comprises forming the first contact pad via through the second dielectric layer and the cover pad opening.

20. The method of claim 19 wherein forming the first contact pad via comprises:
   laser ablating the first and second dielectric layer with a laser; and
   focusing the laser with the cover pad through the first dielectric layer.

* * * * *